(12) United States Patent
Nishikawa et al.

(10) Patent No.: US 7,205,684 B2
(45) Date of Patent: Apr. 17, 2007

(54) SEMICONDUCTOR INTEGRATED CIRCUIT DEVICE AND METHOD FOR DESIGNING THE SAME

(75) Inventors: Ryota Nishikawa, Osaka (JP); Akimitsu Shimamura, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 449 days.

(21) Appl. No.: 10/679,365

(22) Filed: Oct. 7, 2003

(65) Prior Publication Data
US 2004/0094820 A1 May 20, 2004

(30) Foreign Application Priority Data
Nov. 18, 2002 (JP) .............................. 2002-333687

(51) Int. Cl.
*H01H 7/30* (2006.01)
(52) U.S. Cl. ..................................................... 307/147
(58) Field of Classification Search ................. 307/75, 307/72, 147
See application file for complete search history.

(56) References Cited

U.S. PATENT DOCUMENTS

| | | | | |
|---|---|---|---|---|
| 5,610,449 A | * | 3/1997 | Takahashi et al. | 307/43 |
| 5,631,502 A | * | 5/1997 | Shimada | 307/43 |
| 6,600,220 B2 | * | 7/2003 | Barber et al. | 257/685 |
| 2002/0000873 A1 | | 1/2002 | Tanizaki et al. | |
| 2004/0010726 A1 | * | 1/2004 | Motegi et al. | 713/320 |

FOREIGN PATENT DOCUMENTS

| | | |
|---|---|---|
| JP | 8-181215 A | 7/1996 |
| JP | 9-162720 | 6/1997 |

* cited by examiner

*Primary Examiner*—Robert L. DeBeradinis
(74) *Attorney, Agent, or Firm*—McDermott Will & Emery LLP

(57) ABSTRACT

A semiconductor integrated circuit device includes a circuit block with a plurality of components. At least one of the components is supplied with a voltage having a value different from that supplied to the other components. This allows reduction in power consumption in the semiconductor integrated circuit device.

30 Claims, 12 Drawing Sheets

SEMICONDUCTOR INTEGRATED CIRCUIT DEVICE AND METHOD FOR DESIGNING THE SAME

BACKGROUND OF THE INVENTION

The present invention relates to semiconductor integrated circuit devices and method for designing the devices.

With improvement in the performance of, and increase in the scale of integration of, semiconductor integrated circuit devices, increase in power consumption becomes a serious problem. In particular, semiconductor integrated circuit devices used in the field of mobile communication operate with limited amounts of power. Therefore, reduction of power consumption is an important task for the devices.

As a method for reducing power consumption in a semiconductor integrated circuit device, there is a technique of controlling a voltage to be applied to a circuit block constituting the semiconductor integrated circuit device. In this technique, a power supply voltage to be supplied to a circuit block is stepped down to a given value or supply of the power supply voltage is shut off, for every circuit block. In this manner, power reduction in the semiconductor integrated circuit device is achieved (see Japanese Patent No. 3117910).

However, since the control is performed on every circuit block with the technique described above, it is difficult to further reduce the power consumption in the semiconductor integrated circuit device.

In addition, with the downsizing of elements in the semiconductor integrated circuit device, voltage drop is caused by, for example, an IR-Drop effect, resulting in difficulty in achieving high-speed operation which is a purpose of the semiconductor integrated circuit device.

SUMMARY OF THE INVENTION

It is therefore an object of the present invention to provide a semiconductor integrated circuit device in which the power consumption can be reduced, and a method for designing the device. It is another object of the present invention is to provide a semiconductor integrated circuit device in which the power consumption can be reduced without deterioration in the performance thereof, and a method for fabricating the device.

In order to achieve this object, an inventive semiconductor integrated circuit device includes a circuit block with a plurality of components and is characterized in that at least one of the plurality of components is supplied with a voltage having a value different from that supplied to the other component or components.

In this device, a component in the circuit block is supplied with a voltage different from that supplied to the other components. Accordingly, the power consumption in the semiconductor integrated circuit device can be reduced.

The inventive semiconductor integrated circuit device preferably includes at least two power supplies for respectively supplying voltages having mutually different values to the circuit block, wherein one of the power supplies is for supplying a predetermined voltage and the other power supplies are for respectively supplying voltages stepped down from the predetermined voltage in order.

Then, it is possible to supply, for example, voltages stepped down at a given rate or voltages according to the configuration of the semiconductor integrated circuit device to the components. Accordingly, the power consumption in the semiconductor integrated circuit device can be reduced more effectively.

In the inventive semiconductor integrated circuit device, each of the plurality of components is preferably supplied with a voltage in accordance with a signal delay value caused under a given condition along a path to which said each of the components belongs.

Then, the components are supplied with voltages according to the signal delay value. Accordingly, the power consumption in the semiconductor can be reduced more effectively.

In the inventive semiconductor integrated circuit device, at least one of the plurality of components which belongs to a path having a largest signal delay value is preferably supplied with a voltage allowing the signal delay value of the path to be less than or equal to an admissible maximum signal delay value.

Then, it is possible to reduce the power consumption in the semiconductor integrated circuit device, while maintaining the operation speed thereof.

In the inventive semiconductor integrated circuit device, at least one of the plurality of components belonging to a path other than the path having the largest signal delay value is preferably supplied with a voltage lower than the voltage supplied to the path having the largest signal delay value.

Then, the power consumption in the semiconductor can be reduced more effectively.

In the inventive semiconductor integrated circuit device, at least two of the plurality of components belonging to an identical path are preferably supplied with voltages having at least two values, based on the signal delay value.

Then, the power consumption in the semiconductor can be reduced more effectively.

In the inventive semiconductor integrated circuit device, if step-down of a voltage to be supplied to part of the components belonging to a first path is admitted based on the signal delay value, at least one of the plurality of components belonging to both of the first path and a second path is preferably supplied with a voltage lower than a voltage supplied to the other component or components belonging to the first path.

Then, since a component belonging to a plurality of path exhibits a high transition probability, supply of a low voltage to the component allows the power consumption in the semiconductor integrated circuit device to be reduced more effectively.

In the inventive semiconductor integrated circuit device, the plurality of components are preferably divided and placed in a plurality of regions corresponding to the values of voltages to be supplied to the respective regions.

In this device, the components are divided and arranged in the arrangement regions corresponding to voltages. Accordingly, it is possible to reduce the power consumption in the semiconductor integrated circuit device, without performing complicated wiring.

The inventive semiconductor integrated circuit device preferably includes a plurality of power supplies for respectively supplying voltages having mutually different values to the circuit block, wherein each of the values of the voltages to be supplied to the respective one of the plurality of components is determined based on the number of the components supplied with the voltages from the power supplies.

Then, the components can be arranged more effectively in the arrangement regions corresponding to the voltages.

Accordingly, the power consumption in the semiconductor integrated circuit device can be reduced more effectively.

In the inventive semiconductor integrated circuit device, at least one of a plurality of power lines connected to the respective ones of the plurality of components is preferably separated so that the regions corresponding to the values of the voltages to be supplied to the components are defined.

Then, only a minimum change in the flow of designing the semiconductor integrated circuit device allows the formation of a plurality of arrangement regions.

In the inventive semiconductor integrated circuit device, each of the plurality of components is preferably placed in one of the regions, in accordance with a signal delay value caused under a given condition along a path to which said each of the components belongs.

In this device, the components are divided and arranged in the arrangement regions corresponding to voltages. Accordingly, the power consumption in the semiconductor integrated circuit device can be reduced more effectively.

In the inventive semiconductor integrated circuit device, at least two of the plurality of components belonging to an identical path are preferably placed in at least two mutually different regions among the regions, based on a signal delay value caused under a given condition along a path to which each of the plurality of components belongs.

Then, the power consumption in the semiconductor integrated circuit device can be reduced more effectively.

In the inventive semiconductor integrated circuit device, if step-down of a voltage to be supplied to part of the components belonging to a first path is admitted based on the signal delay value caused under a give condition along a path to which each of the plurality of components belong, at least one of the components belonging to both of the first path and a second path is preferably placed in a region supplied with a voltage lower than a voltage supplied to a region in which the other component or components belonging to the first path is/are placed.

Then, since a component belonging a plurality of paths exhibits a high transition probability, supply of a low voltage to the component allows the power consumption in the semiconductor integrated circuit device to be reduced more effectively.

In the inventive semiconductor integrated circuit device, at least one of the regions is preferably further divided into a plurality of regions in accordance with the distance from a power line.

In the device, a region is further divided into a plurality of regions in accordance with voltage drop. Therefore, the variation in voltage to be applied to the component can be increased as well as complicated control on the power supply is not necessary. Accordingly, the power consumption in the semiconductor integrated circuit device can be reduced more effectively and, in addition, deterioration in the performance thereof due to voltage drop can be prevented.

In the inventive semiconductor integrated circuit device, the distance from the power line is preferably a distance in which an IR-Drop effect is taken into consideration.

In the inventive semiconductor integrated circuit device, each of the plurality of components is preferably placed in one of the further-divided regions, in accordance with a signal delay value caused under a given condition along a path to which said each of the components belongs.

In this device, the components are placed in the further-divided regions. Accordingly, the power consumption in the semiconductor integrated circuit device can be reduced more effectively.

In the inventive semiconductor integrated circuit device, at least one of the plurality of components belonging to a path having a maximum signal delay value is preferably placed in a region which is nearest the power line among the further-divided regions.

Then, deterioration in the performance of the semiconductor integrated circuit device due to voltage drop can be prevented and, in addition, the power consumption therein can be reduced more effectively.

In the inventive semiconductor integrated circuit device, at least one of the plurality of components belonging to a path having a signal delay value less than an admissible maximum signal delay value under a condition in which the component is placed in one of the further-divided regions, is preferably placed in another region having a larger distance from the power line than said one of the further-divided regions such that the signal delay value of the path is less than or equal to the admissible maximum signal delay value.

In this device, a component having allowance for the signal delay value is placed in a region having a large influence of voltage drop. Accordingly, it is possible to reduce the power consumption in the semiconductor integrated circuit device in more detail, while maintaining the performance thereof.

In the inventive semiconductor integrated circuit device, the further-divided regions are preferably further divided into a plurality of regions in accordance with the number of connection elements connected to the power line.

In the device, power supply voltages to be supplied to the components of the semiconductor integrated circuit device can be set in more detail by utilizing the difference in resistance according to the number of the connection elements. Accordingly, the power consumption in the semiconductor integrated circuit device can be reduced more effectively.

To solve the problems described above, an inventive method for designing a semiconductor integrated circuit device including a circuit block with a plurality of components is characterized in that at least one of the plurality of components is supplied with a voltage having a value different from that supplied to the other component or components.

With this inventive method, a component in a circuit block is supplied with a voltage different from that supplied to the other components. Accordingly, a design for reducing the power consumption in the semiconductor integrated circuit device can be achieved.

In the inventive method, a signal delay value caused under a given condition along a path to which each of the plurality of components belongs is preferably calculated statistically, and the smallest voltage among voltages at which the signal delay value of the path is less than or equal to an admissible maximum signal delay value is preferably supplied as a voltage which is to be supplied to the components and has a magnitude less than or equal to the second largest value, based on the signal delay value.

Then, a voltage at which the power consumption is the smallest can be determined based on a signal delay value calculated statistically. Accordingly, a design for reducing the power consumption in the semiconductor integrated circuit device can be achieved more effectively than in the case of supplying voltages stepped down at a given rate.

In the inventive method, a signal delay value caused under a given condition along a path to which each of the plurality of components belongs is preferably calculated, and a value according to the signal delay value is preferably supplied to each of the components.

Then, voltages according to the signal delay value are supplied to the respective components. Accordingly, a design for reducing the power consumption in the semiconductor integrated circuit device can be achieved more effectively.

In the inventive method, voltages having at least two values are preferably supplied to at least two of the plurality of components belonging to an identical path, based on the signal delay value.

Then, a design for reducing the power consumption in the semiconductor integrated circuit device can be achieved more effectively.

In the inventive method, if step-down of a voltage to be supplied to part of the components belonging to a first path is admitted based on the signal delay value, at least one of the components belonging to both of the first path and a second path is preferably supplied with a voltage lower than a voltage supplied to the other component or components belonging to the first path.

Then, since a component belonging a plurality of paths exhibits a high transition probability, supply of a low voltage to the component can achieve a design for reducing the power consumption in the semiconductor integrated circuit device more effectively.

In the inventive method, a signal delay value caused under a given condition along a path to which each of the plurality of components belongs is preferably calculated statistically, and a plurality of regions corresponding to the values of voltages to be respectively supplied thereto are preferably provided in the semiconductor integrated circuit device, based on the signal delay value.

Then, a plurality of arrangement regions corresponding to voltages are provided based on the signal delay value. Accordingly, a design for reducing the power consumption in the semiconductor integrated circuit device can be achieved more effectively.

In the inventive method, the value of a voltage to be supplied to each of the plurality of components is preferably determined based on the number of the components to which voltages are supplied from a plurality of power supplies for respectively supplying mutually different voltages to the circuit block.

Then, a plurality of components can be arranged in arrangement regions corresponding to voltages. Accordingly, a design for reducing the power consumption in the semiconductor integrated circuit device can be achieved more effectively.

In the inventive method, at least one of a plurality of power lines connected to the respective ones of the plurality of components is preferably separated so that the regions corresponding to the values of the voltages to be supplied to the respective components are defined.

Then, only a minimum change in a flow of designing the semiconductor integrated circuit device allows the formation of a plurality of arrangement regions.

In the inventive method, each of the plurality of components is preferably placed in one of the regions, based on the signal delay value.

Then, a plurality of components are divided and arranged in arrangement regions corresponding to voltages, based on the signal delay value. Accordingly, a design for reducing the power consumption in the semiconductor integrated circuit device can be achieved without complicated wiring for power supplies.

In the inventive method, at least two of the plurality of components belonging to an identical path are preferably placed in at least two mutually different regions among the regions, based on the signal delay value.

Then, a design for reducing the power consumption in the semiconductor integrated circuit device can be achieved more effectively.

In the inventive method, if step-down of a voltage to be supplied to part of the components belonging to a first path is admitted based on the signal delay value, at least one of the components belonging to both of the first path and a second path is preferably placed in a region supplied with a voltage lower than a voltage supplied to a region in which the other component or components belonging to the first path is/are placed.

Then, since a component belonging a plurality of paths exhibits a high transition probability, supply of a low voltage to the component can achieve a design for reducing the power consumption in the semiconductor integrated circuit device more effectively.

In the inventive method, at least one of the regions is preferably further divided into a plurality of regions in accordance with the distance from a power line.

Then, a region is further divided into a plurality of regions in consideration of voltage drop. Therefore, the variation in voltage to be applied to the component can be increased as well as complicated control on power supply is not necessary. Accordingly, a design for reducing the power consumption in the semiconductor integrated circuit device can be achieved more effectively and, in addition, deterioration in the performance thereof due to voltage drop can be prevented.

In the inventive method, the distance from the power line is preferably a distance in which an IR-Drop effect is taken into consideration.

In the inventive method, a signal delay value caused under a given condition along a path to which each of the plurality of components belongs is preferably calculated, and each of the components is preferably placed in one of the further-divided regions based on the signal delay value.

Then, a plurality of components are placed in regions which have been further divided. Accordingly, a design for reducing the power consumption in the semiconductor integrated circuit device can be achieved more effectively.

In the inventive method, one of the plurality of components belonging to a path having a signal delay value less than an admissible maximum signal delay value under a condition in which the component is placed in one of the further-divided regions, is preferably placed in another region having a larger distance from the power line than said one of the further-divided regions such that the signal delay value of the path is less than or equal to the admissible maximum signal delay value.

Then, a component having allowance for the signal delay value is placed in a region having a large influence of voltage drop. Accordingly, it is possible to reduce the power consumption in the semiconductor integrated circuit device in more detail, while maintaining the performance thereof.

In the inventive method, a voltage to be supplied to a region in which at least one of the plurality of components belonging to a path having a signal delay value less than an admissible maximum signal delay value is placed is preferably reduced by changing the number of connection elements in a power line to which the component is connected.

Then, a lower voltage is supplied to a component having allowance for a signal delay value by changing the number of components connected to a power line. Accordingly, a design for reducing the power consumption in the semiconductor integrated circuit device can be achieved more effec-

DESCRIPTION OF THE PREFERRED EMBODIMENTS

Hereinafter, embodiment of the present invention will be described with reference to the drawings.

Embodiment 1

Figure 1:
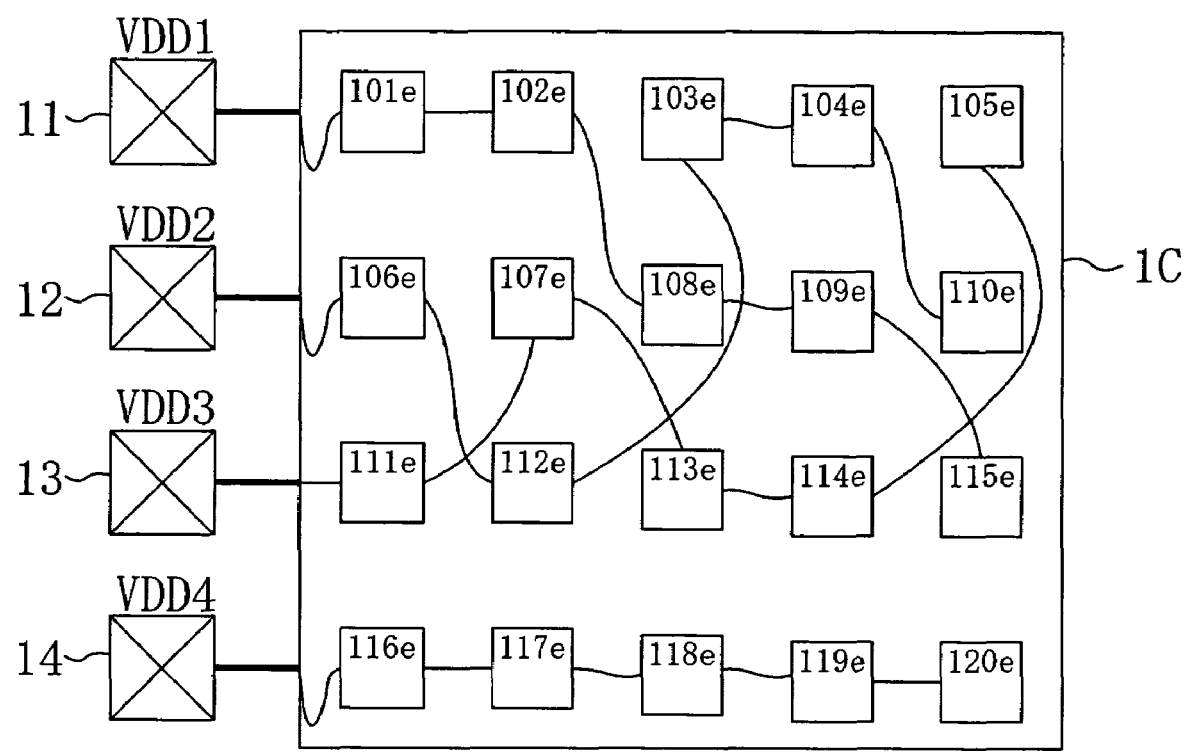
FIG. 1 is a diagram showing an example of a configuration of a semiconductor integrated circuit device according to a first embodiment of the present invention.

FIG. 1 is a diagram showing an example of a configuration of a semiconductor integrated circuit device according to a first embodiment of the present invention.

With respect to the semiconductor integrated circuit device shown in FIG. 1, a circuit block 1C and power supplies 11 through 14 are shown.

The circuit block 1C includes elements $101e$ through $120e$ constituting the block 1C (hereinafter referred to as components). Each of the components $101e$ through $120e$ is supplied with one of voltages VDD1 through VDD4 from the respective power supplies 11 through 14 (indicated by bold lines in FIG. 1). FIG. 1 shows that the components $101e$ through $120e$ are connected to one another with paths. In this embodiment, the circuit block is a block in a circuit including components such as an AND gate and an OR gate.

The voltages VDD2 through VDD4 to be supplied to the circuit block 1C are either voltages which have been stepped down at a given rate using the rated voltage VDD1 for the semiconductor integrated circuit device as a reference or voltages stepped down based on the configuration of the semiconductor integrated circuit device, and are supplied to the components $101e$ through $120e$.

In this manner, a power supply voltage is supplied to a unit smaller than the circuit block, i.e., to every component, so that the power consumption in the semiconductor integrated circuit device can be reduced.

Figure 2A:
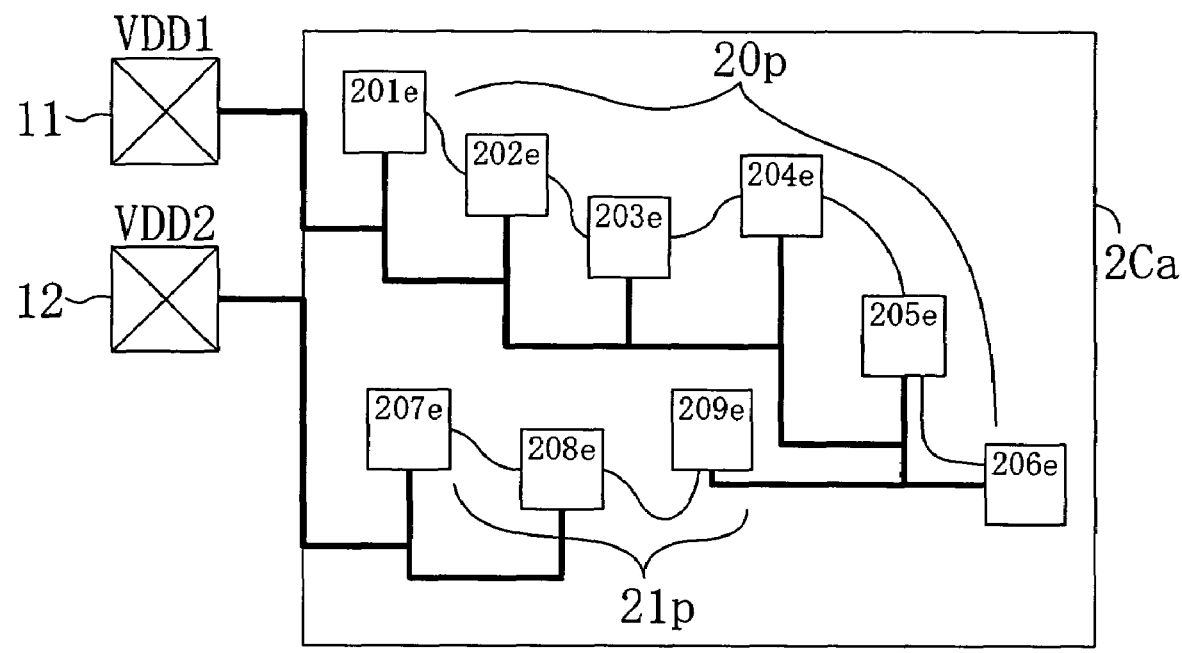
FIGS. 2A and 2B are diagrams showing respective examples of configurations of the semiconductor integrated circuit device of the first embodiment.
Figure 2B:
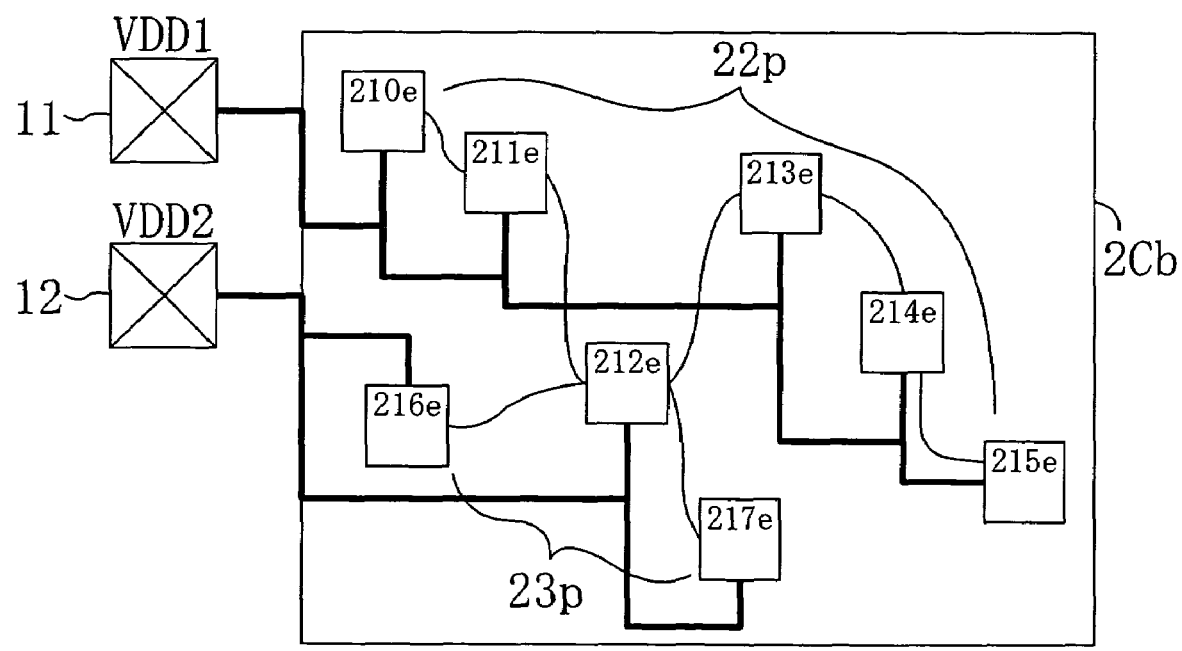

FIGS. 2A and 2B are diagrams showing respective circuit blocks 2Ca and 2Cb for use in describing the first embodiment in more detail. The bold solid lines drawn from respective power supplies represent power lines, as in the subsequent drawings.

A signal delay value, which will be used in the following description, is a value previously obtained under a given condition from a signal delay value of a path to which the components belong.

A voltage VDD2 stepped down from the rated voltage VDD1 by a predetermined interval is supplied to the circuit block 2Ca shown in FIG. 2A. The circuit block 2Ca includes components $201e$ through $209e$. Each of the components $201e$ through $209e$ belongs to either a path $20p$ or a path $21p$, as shown in FIG. 2. Specifically, the components $201e$ through $206e$ belong to the path $20p$, and the components $207e$ through $209e$ belong to the path $21p$.

Within the circuit block 2Ca, the voltage VDD1 is supplied from the power supply 11 to the components $201e$ through $206e$ belonging to the path $20p$ having the largest signal delay value. On the other hand, the voltage VDD1 from the power supply 11 or the voltage VDD2 from the power supply 12 is supplied to the components $207e$ through $209e$ belonging to the path $21p$ whose signal delay value has a difference from the admissible maximum signal delay value (which is the maximum signal delay value that does not cause timing violation in the semiconductor integrated circuit device as will be described in a later embodiment) more than that of the path $20p$. In this case, the voltage VDD1 or VDD2 is supplied to the components within a range in which the signal delay value of a path in the circuit block 2Ca (e.g., the path $21p$ in FIG. 2A) does not exceed the admissible maximum signal delay value. For example, FIG. 2A shows a configuration in which the voltage VDD1 is supplied to the component $209e$ and the voltage VDD2 lower than the voltage VDD1 is supplied to the components $207e$ and $208e$.

The path $20p$ having the largest signal delay value determines the operating speed of the semiconductor integrated circuit device. Accordingly, by supplying the voltage VDD1 to the components $201e$ through $206e$ belonging to the path $20p$ having the largest signal delay value as well as supplying the voltage VDD2, stepped down from the voltage VDD1, to the components $207e$ through $208e$ belonging to the path $21p$ whose signal delay value has enough difference from the admissible maximum signal delay value, it is possible to reduce the power consumption in the semiconductor integrated circuit device, while maintaining the operating speed thereof. In addition, by supplying the voltage VDD1 to the component $209e$ belonging to the path $21p$, for example, such that the signal delay value of the path $21p$ does not exceed the admissible maximum signal delay value, it is possible to prevent the performance of the semiconductor integrated circuit device from being deteriorated.

Next, the voltages VDD1 and VDD2 are supplied to the circuit block 2Cb shown in FIG. 2B. The circuit block 2Cb includes components 210e through 217e. Each of the components 210e through 217e belongs to a path 22p or a path 23p, as shown in FIG. 2B. Specifically, the components 210e through 215e belong to the path 22p, and the components 216e, 212e and 217e belong to the path 23p. The component 212e belongs to both of the paths 22p and 23p.

Within the circuit block 2Cb, the voltage VDD1 is supplied from the power supply 11 to the components 210e, 211e, 213e, 214e and 215e belonging only to the path 22p having the largest signal delay value. On the other hand, the voltage VDD2 is supplied from the power supply 12 to the components 216e, 212e and 217e belonging to the path 23p whose signal delay value has a difference from the admissible maximum signal delay value more than that of the path 22p. In this manner, if step-down of the voltage to be supplied to part of the components belonging to the path 22p is admitted based on the signal delay value of the path 22p, the voltage VDD2 is supplied to the component 212e belonging to both of the paths 22p and 23p. Accordingly, since a component belonging to a plurality of paths exhibits a high transition probability, supply of a low voltage to the component reduces the power consumption in the semiconductor integrated circuit device effectively.

Embodiment 2

In the following second embodiment of the present invention, as a method for reducing the power consumption by supplying power supply voltages to respective components constituting a circuit block, a method for reducing the power consumption by arranging components in regions defined in accordance with respective voltages (hereinafter, referred to arrangement regions) will be described.

Figure 3:
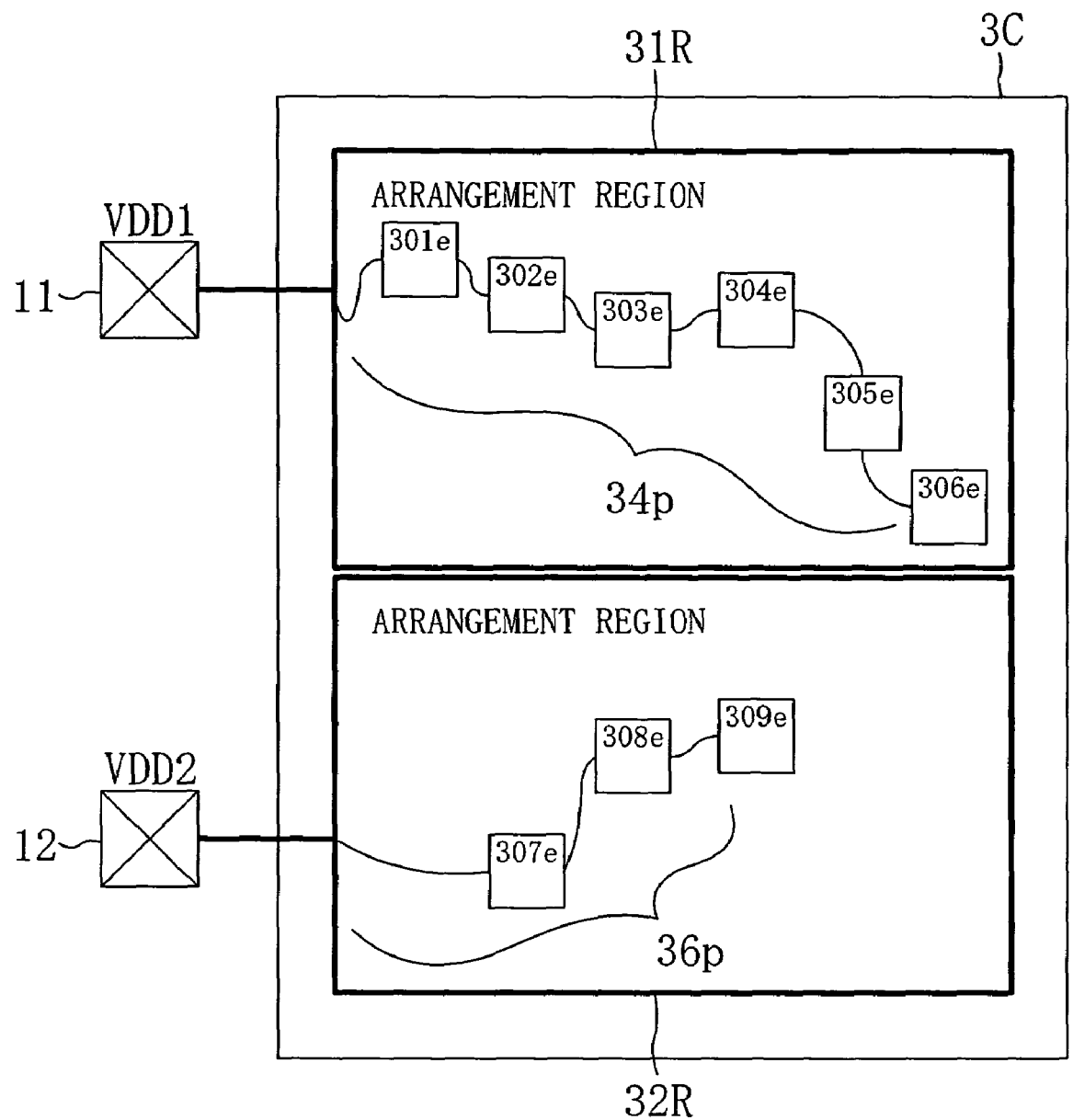
FIG. 3 is a diagram showing an example of a configuration of a semiconductor integrated circuit device according to a second embodiment of the present invention.

FIG. 3 is a diagram showing an example of a configuration of a semiconductor integrated circuit device according to the second embodiment.

As shown in FIG. 3, arrangement regions 31R and 32R are provided in a circuit block 3C, a voltage VDD1 is supplied from a power supply 11 to the arrangement region 31R and a voltage VDD2 is supplied from a power supply 12 to the arrangement region 32R. The arrangement region 31R includes components 301e through 306e which belong to a path 34p, while the arrangement region 32R includes components 307e through 309e which belong to a path 36p. The power supplies 11 and 12 are the same as those described in the first embodiment. Signal delay values to be used in the following description are the same as those described in the first embodiment.

The voltage VDD1 is supplied from the power supply 11 to the arrangement region 31R including the components 301e through 306e belonging to the path 34p having the largest signal delay value in the circuit block 3C. On the other hand, the voltage VDD2 is supplied from the power supply 12 to the arrangement region 32R including the components 307e through 309e belonging to the path 36p whose signal delay value has enough difference from the admissible maximum signal delay value.

As described above, the voltage VDD1 is supplied to the arrangement region 31R including the components 301e through 306e belonging to the path 34p having the largest signal delay value. On the other hand, the voltage VDD2 lower than the voltage VDD1 is supplied to the arrangement region 32R including the components 307e through 309e belonging to the path 36p whose signal delay value has enough difference from the admissible maximum signal delay value. As a result, it is possible to reduce the power consumption in the semiconductor integrated circuit device, while maintaining the operating speed thereof.

Figure 4:
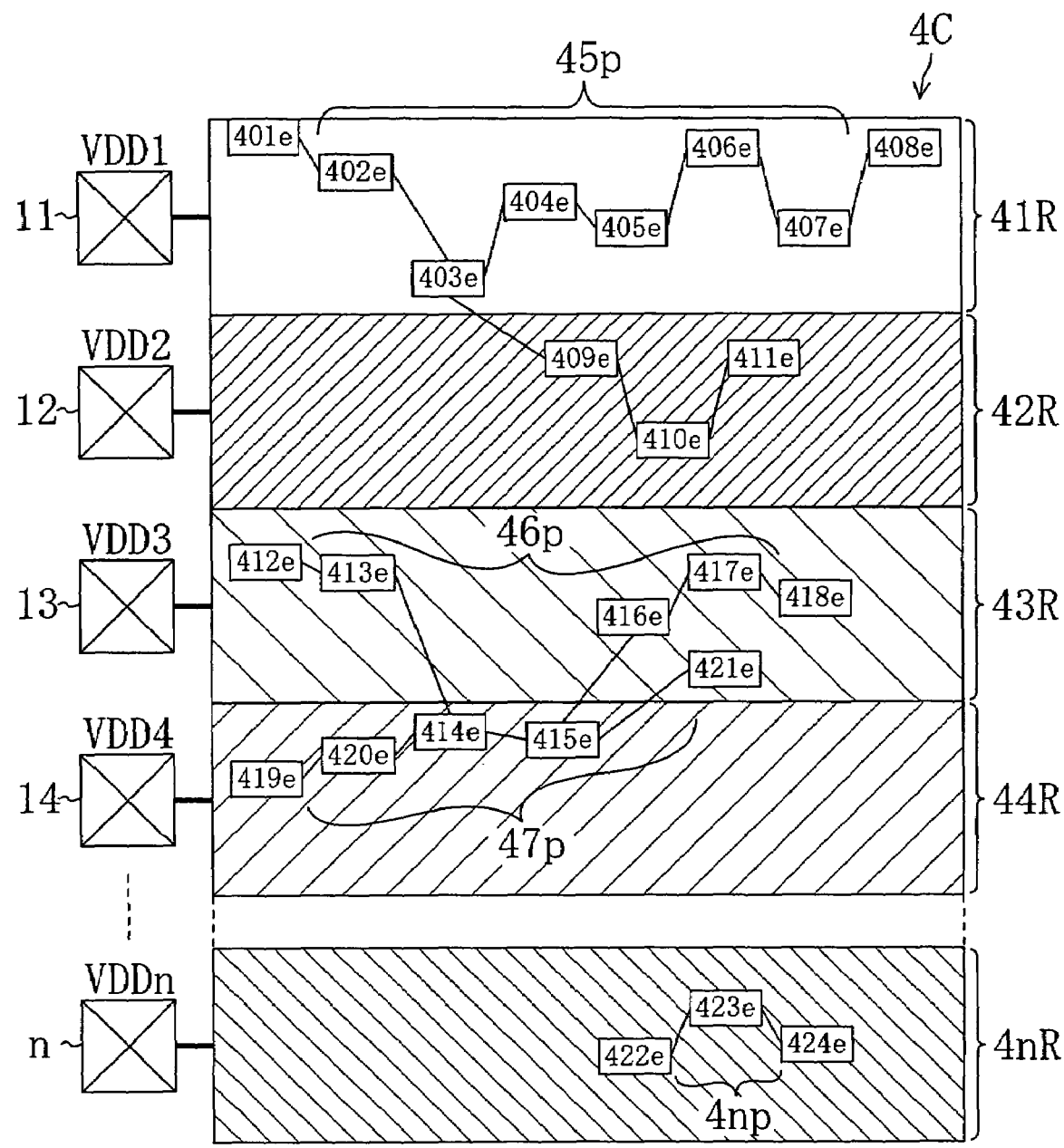
FIG. 4 is a diagram showing another example of the configuration of the semiconductor integrated circuit device of the second embodiment.

FIG. 4 is a diagram showing another example of the configuration of the semiconductor integrated circuit device of the second embodiment.

As shown in FIG. 4, arrangement regions 41R, 42R, 43R, 44R, . . . , and 4nR are provided in a circuit block 4C. A voltage VDD1 from a power supply 11, a voltage VDD2 from a power supply 12, a voltage VDD3 from a power supply 13, a voltage VDD4 from a power supply 14, . . . , and a voltage VDDn from a power supply n are supplied to the arrangement regions 41R, 42R, 43R, 44R, . . . , and 4nR, respectively. The voltages VDD1, VDD2, VDD3, VDD4, . . . , and VDDn are voltages which have been stepped down from the rated voltage VDD1 at a given rate.

The highest voltage VDD1 is supplied to the arrangement region 41R including components 401e through 408e belonging to a path 45p having the largest signal delay value. On the other hand, components 409e through 411e belonging to a path 45p which branches off from the path 45p have a signal delay value with enough difference from the admissible maximum signal delay value, and thus are arranged in the arrangement region 42R to which the voltage VDD2 lower than the voltage VDD1 is supplied. With respect to the path 4nP having the smallest signal delay value, the value of signal delay occurring along the path has enough difference from the admissible maximum signal delay value. Accordingly, components 422e through 424e belonging to the path 4nP are arranged in the arrangement region 4nP to which the lowest voltage VDDn is supplied.

As described above, the components belonging to the paths are arranged in the arrangement regions supplied with lower voltages, in the range in which the signal delay values of the paths to which the components belong do no exceed the admissible maximum signal delay value. As a result, the power consumption in the semiconductor integrated circuit device can be reduced.

In addition, as shown in FIG. 4, components 414e and 415e belonging to both of the paths 46p and 47p are arranged not in the arrangement region 43R in which the other components 412e, 413e, 416e, 417e and 418e belonging to the path 46p, but in the arrangement region 44R. This is because of the same purpose as in the first embodiment. That is to say, in the case where step-down of a voltage to be supplied to part of the components 412e through 418e belonging to the path 46p is admitted based on the signal delay value of the path 46p, the components 414e and 415e belonging to both of the paths 46p and 47p are arranged in the region to which the voltage VDD4 lower than the voltage VDD3 is supplied. In this manner, by supplying the low voltage to the components exhibiting a high transition probability, the power consumption in the semiconductor integrated circuit device can be reduced more effectively.

Embodiment 3

In the following third embodiment of the present invention, a method for reducing the power consumption in consideration of voltage drop caused by, for example, an IR-Drop effect will be described.

Figure 5:
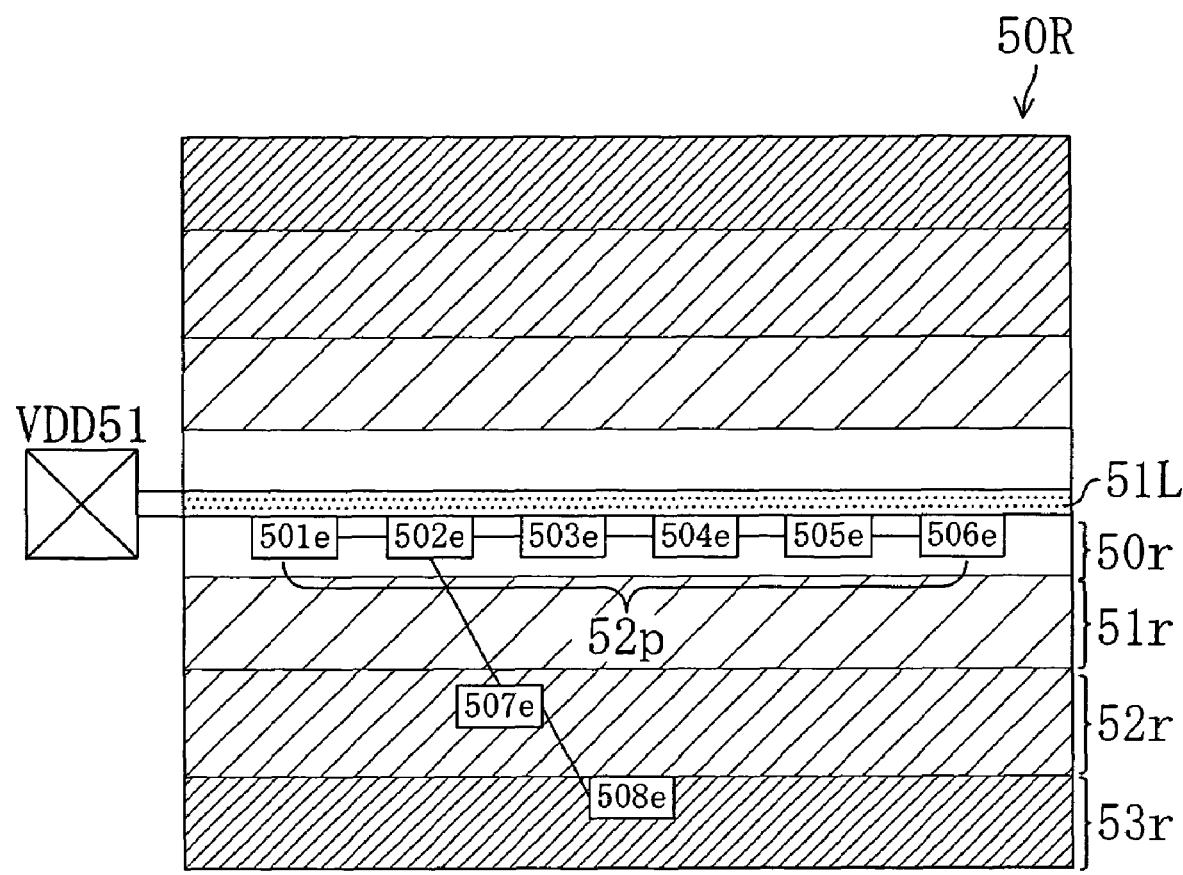
FIG. 5 is a diagram showing an example of a configuration of a semiconductor integrated circuit device according to a third embodiment of the present invention.

FIG. 5 is a diagram showing an example of a configuration of a semiconductor integrated circuit device according to the third embodiment. FIG. 5 shows, as an example of the arrangement regions described in the fourth embodiment, a configuration of the inside of an arrangement region in consideration of voltage drop caused by, for example, an IR-Drop effect occurring inside the arrangement region.

As shown in FIG. 5, a power line 51L for supplying a voltage VDD51 is provided in the middle of an arrangement region 50R and a voltage drop is caused by, for example, an IR-Drop effect in the arrangement region 50R. For example, description will be given on the lower half of the arrangement region 50R. The lower half of the arrangement region 50R includes: a region 50*r* which is nearest the power line 51L and has the highest voltage; regions 51*r* and 52*r* having voltages which have been stepped down in this order; and a region 53*r* which is farthest from the power line 51L and has the lowest voltage.

Accordingly, within the arrangement region 50R supplied with a voltage from a power supply, components 501*e* through 506*e* which belong to a path 52*p* having the largest signal delay value are arranged in the region 50*r* exhibiting the smallest voltage drop, as shown in FIG. 5. Components 507*e* and 508*e* which belong to a path which branches off the path 52*p*, and the value of signal delay occurring along the path has enough difference from the admissible maximum signal delay value. Accordingly, the component 507*e* is placed in the region 52*r*, and the component 508*e* is placed in the region 53*r*, for example, as shown in FIG. 5.

As described above, in an arrangement region supplied with a voltage from a power supply, if the voltage is stepped down in order, components are arranged in appropriate regions in the arrangement region based on the value of signal delay occurring along a path. Accordingly, it is possible to prevent deterioration in the performance of the semiconductor integrated circuit device caused by voltage drop occurring in downsizing elements of the device. As a result, the power consumption in the semiconductor integrated circuit device can be reduced more effectively.

Embodiment 4

In the following fourth embodiment of the present invention, a specific method for forming arrangement regions in which components are arranged and which are defined in accordance with respective voltages will be described.

Figure 6A:
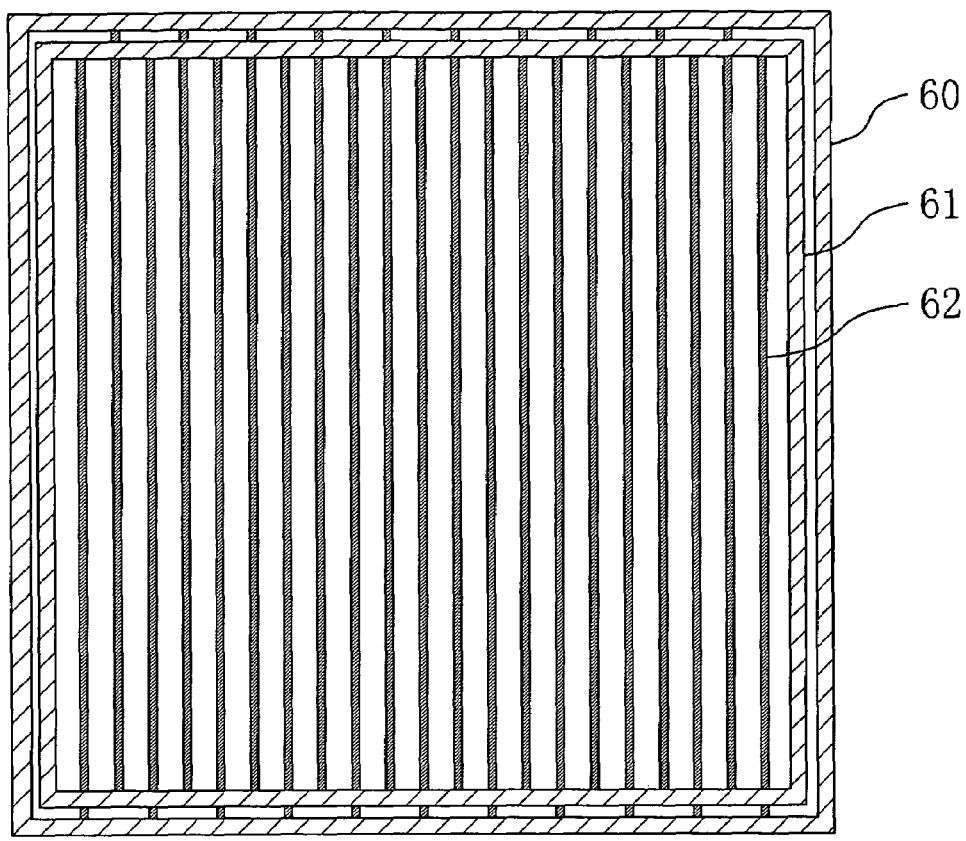
FIGS. 6A and 6B are diagrams showing examples of configurations of a semiconductor integrated circuit device according to a fourth embodiment of the present invention.
Figure 6B:
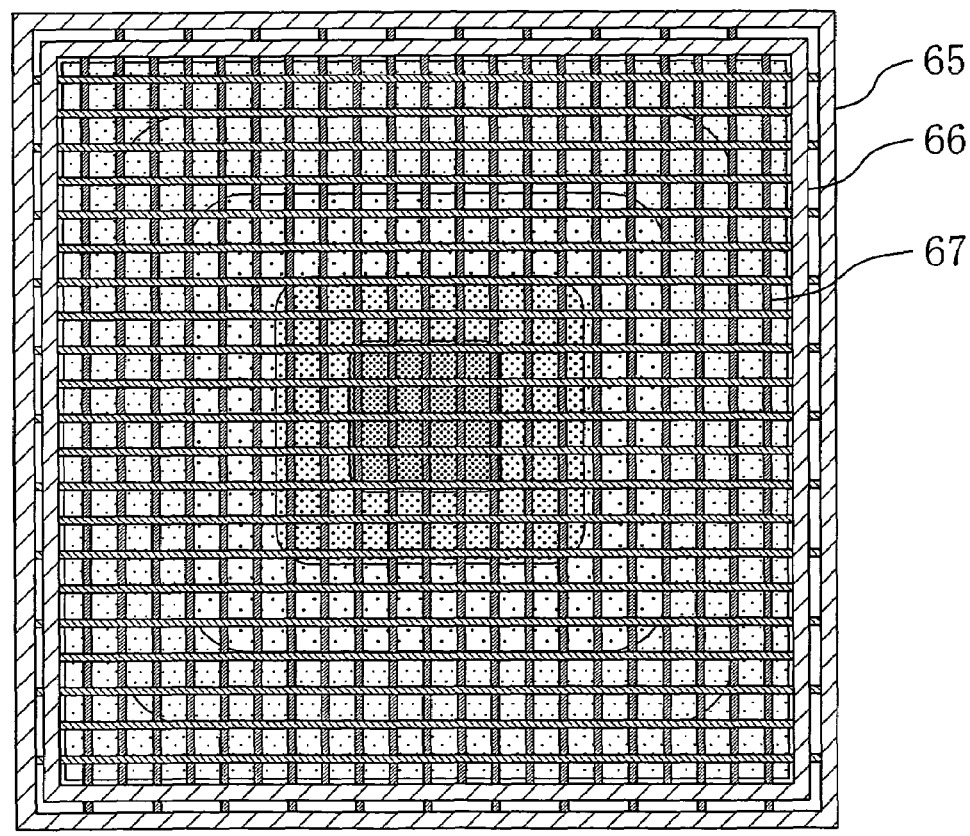

FIGS. 6A and 6B are views respectively showing examples of layouts of a semiconductor integrated circuit device according to the fourth embodiment. FIGS. 6A and 6B show examples of layouts in the case where a plurality of power supply voltages are supplied to the semiconductor integrated circuit device.

In the layout shown in FIG. 6A, main power lines 60 and 61 for supplying power supply voltages from the surroundings of the semiconductor integrated circuit device and secondary power lines 62 for supplying the power supply voltages from main power supplies to a center portion of the semiconductor integrated circuit device are provided, for the purpose of supplying a plurality of power supply voltages to the semiconductor integrated circuit device. The main power supplies are provided in the same number as that of the power supply voltages to be supplied to the semiconductor integrated circuit device, and the mutually different power supply voltages are supplied to the main power lines 60 and 61.

In the layout shown in FIG. 6B, main power lines 65 and 66 for supplying power supply voltages from the surrounding of the semiconductor integrated circuit device and secondary power lines 67 for supplying the power supply voltages to a center portion of the semiconductor integrated circuit device from the main power lines 65 and 66 are provided. In order to minimizing an IR-Drop effect caused in a process for fabricating a miniaturized semiconductor integrated circuit device, the secondary power lines 67 have a mesh configuration in an upper-layer part in wiring layers.

Such a power line configuration allows one of the power supply voltages supplied to the semiconductor integrated circuit device to be supplied to substantially an arbitrary arrangement region in the semiconductor integrated circuit device.

Figure 7A:
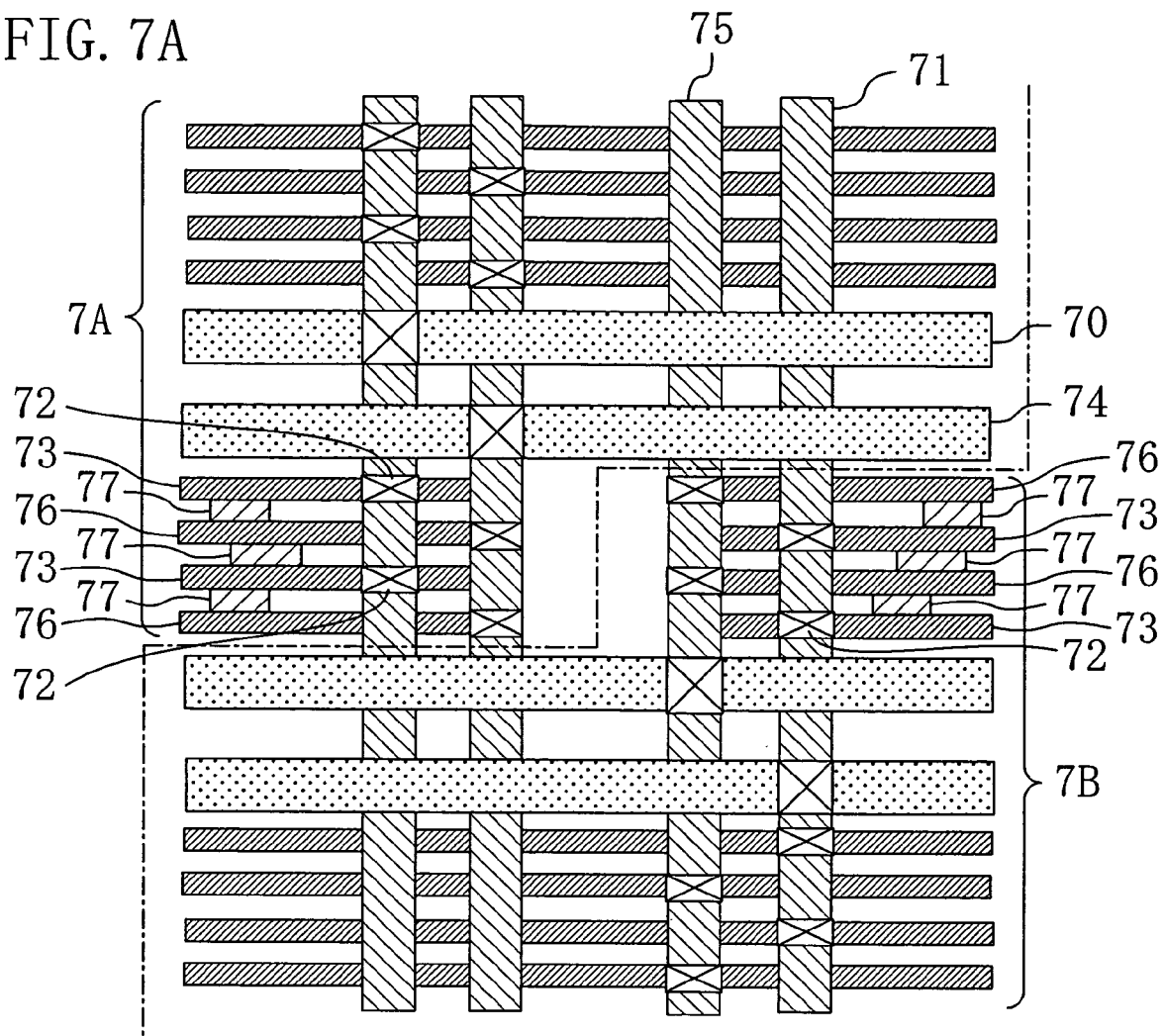
FIG. 7A is a plan view showing an example of a layout of the semiconductor integrated circuit device of the fourth embodiment.
Figure 7B:
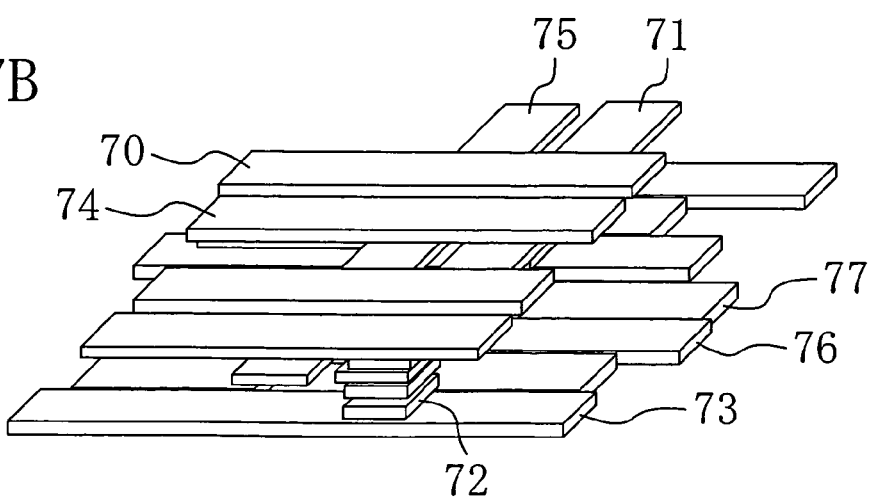
FIG. 7B is a three-dimensional view of the layout.

FIGS. 7A and 7B are views showing a portion of the layout example of the supply lines in the semiconductor integrated circuit device of the fourth embodiment. FIG. 7A is a plan view showing the portion of the example of the layout shown in FIG. 6B. FIG. 7B is a three-dimensional view illustrating the portion shown in FIG. 7A in three dimensions.

In the layouts shown in FIGS. 7A and 7B, power supply voltages are supplied from secondary power lines 70 and 71 to power lines 73 connected to components 77 of the semiconductor integrated circuit device by way of respective line-connecting elements 72. The secondary power lines 70 and 71 are in pairs with their corresponding ground lines 74 and 75, respectively. The ground lines 74 and 75 are connected, by way of line-connecting elements, to ground lines 76 connected to components 77 of the semiconductor integrated circuit device. The power lines 73 and the ground lines 76 are formed in pairs along respective reference lines for arranging the components 77. Each of the components 77 of the semiconductor integrated circuit device are placed between one of the power lines 73 and the associated one of the ground lines 76.

As shown in the center of FIG. 7A, power lines for supplying power supply voltages to components of the semiconductor integrated circuit device are separated, thereby defining an arrangement region 7A to which a power supply voltage is supplied via the secondary supply line 70 and the ground line 74 and an arrangement region 7B to which a power supply voltage is supplied via the secondary power line 71 and the ground line 75. In this manner, arrangement regions supplied with different power supply voltages can be formed in substantially arbitrary positions in the semiconductor integrated circuit device. The arrangement regions supplied with a plurality of different power supply voltages described using FIGS. 4 and 5 can be formed in the same manner.

Embodiment 5

In the following fifth embodiment of the present invention, a method for reducing the power consumption in consideration of voltage drop caused by, for example, the IR-Drop effect described above will be described in more detail.

Figure 8A:
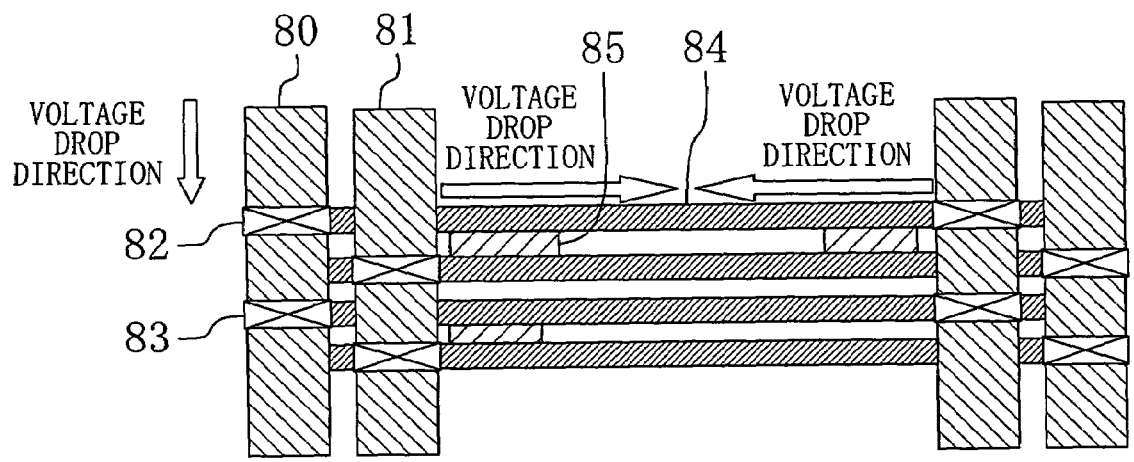
FIGS. 8A and 8B are plan views showing respective examples of layouts of a semiconductor integrated circuit device according to a fifth embodiment of the present invention.
Figure 8B:
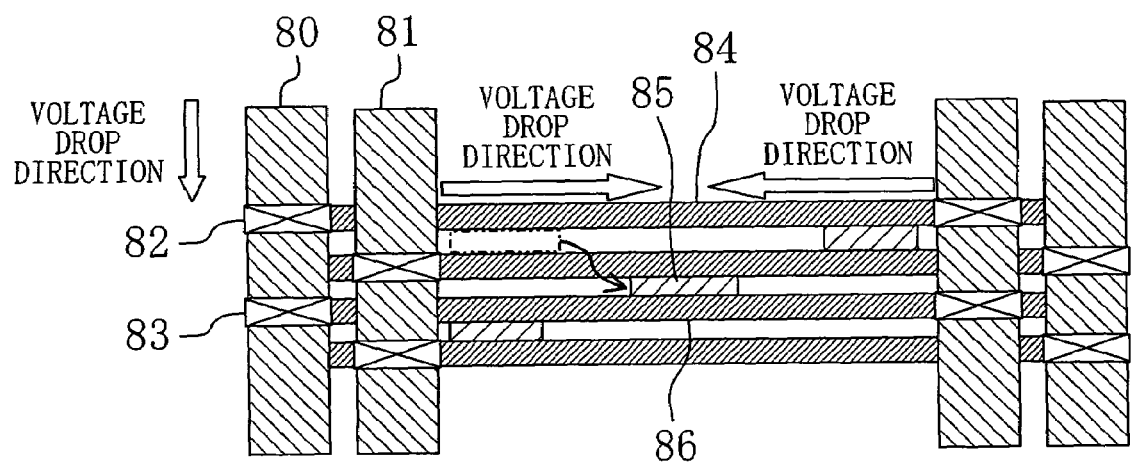

FIGS. 8A and 8B are views showing respective examples of layouts of a semiconductor integrated circuit device according to the fifth embodiment. FIGS. 8A and 8B are views for use in describing the method for reducing the power consumption in consideration of voltage drop in detail.

In the layout shown in FIG. 8A, a secondary power line 80 and a ground line 81 are provided in pair, and power supplying lines 84 for supplying power supply voltages to components of the semiconductor integrated circuit device via line-connecting elements 82 and 83 are formed. The power supply voltage supplied through the secondary power line 80 is lower at the line-connecting element 83 than at the line-connecting element 82, because of an IR-Drop effect. In addition, the power supply voltage supplied through the power supplying line 84 also becomes lower as the distance from the line-connecting element 82 increases, because of the IR-Drop effect. Accordingly, if the amounts of such drops in power supply voltage are considered, the power consumption in the semiconductor integrated circuit device can be reduced.

In FIG. 8A, in the case where a component 85 of the semiconductor integrated circuit device is a component which belongs to, for example, a path whose signal delay value has enough difference from the admissible maximum signal delay value as described using FIG. 5, if the component 85 is shifted to the position indicated in FIG. 8B, a power supply voltage supplied to the component 85 is reduced because of the IR-Drop effect along the secondary power line 80 and the IR-Drop effect along the power supplying line 86. As a result, it is possible to reduce the power consumption in the semiconductor integrated circuit device without deteriorating the performance thereof.

Figure 9:
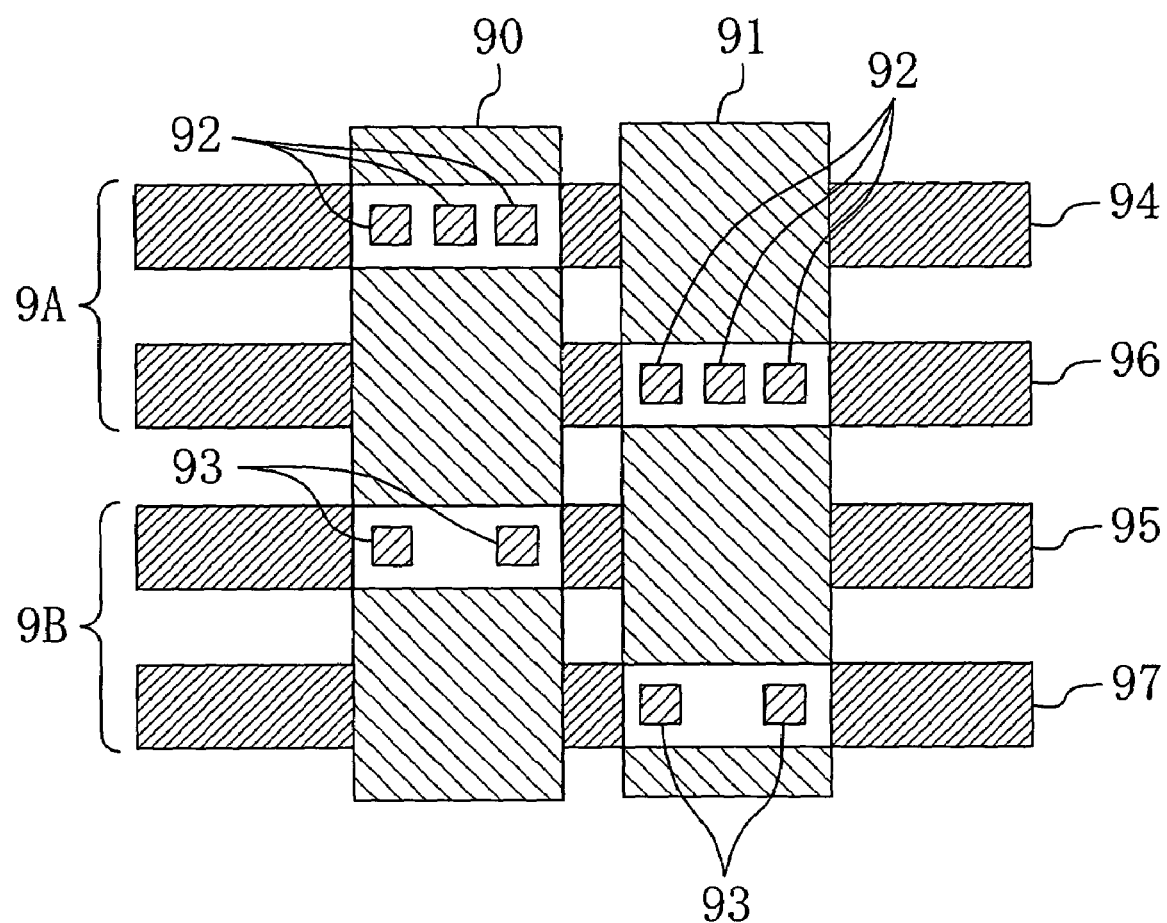
FIG. 9 is a plan view showing an example of the layout of the semiconductor integrated circuit device of the fifth embodiment.

FIG. 9 is a view showing an example of a layout of the semiconductor integrated circuit device of the fifth embodiment and is used for describing another method for reducing the power consumption in consideration of voltage drop.

In the layout shown in FIG. 9, a secondary power line 90 or a ground line 91 is connected to power supplying lines 94 and 95, or 96 and 97 for supplying power supply voltages to components of the semiconductor integrated circuit device via line-connecting elements 92 and 93. Ground lines 96 and 97 are provided in pairs with the power supplying lines 94 and 95, respectively. The power supplying line 94 is connected to the secondly power line 90 at three connection points of the line-connecting element 92. On the other hand, the power supplying line 95 is connected to the secondary line 90 at two connection points of the line-connecting element 93. Accordingly, difference in resistance between the connecting elements 92 and 93 allows different power supply voltages to be supplied to the respective power supplying lines 94 and 95. In this manner, by changing the number of connection points of the connecting elements, it is possible to form arrangement regions 9A and 9B exhibiting mutually different degrees of the IR-Drop effect. Accordingly, the power supply voltages to be supplied to the components of the semiconductor integrated circuit device can be set in detail.

Embodiment 6

In the following sixth embodiment of the present invention, a specific method for designing a semiconductor integrated circuit device for the purpose of supplying power supply voltages individually to respective components of the semiconductor integrated circuit device will be described.

Figure 10:
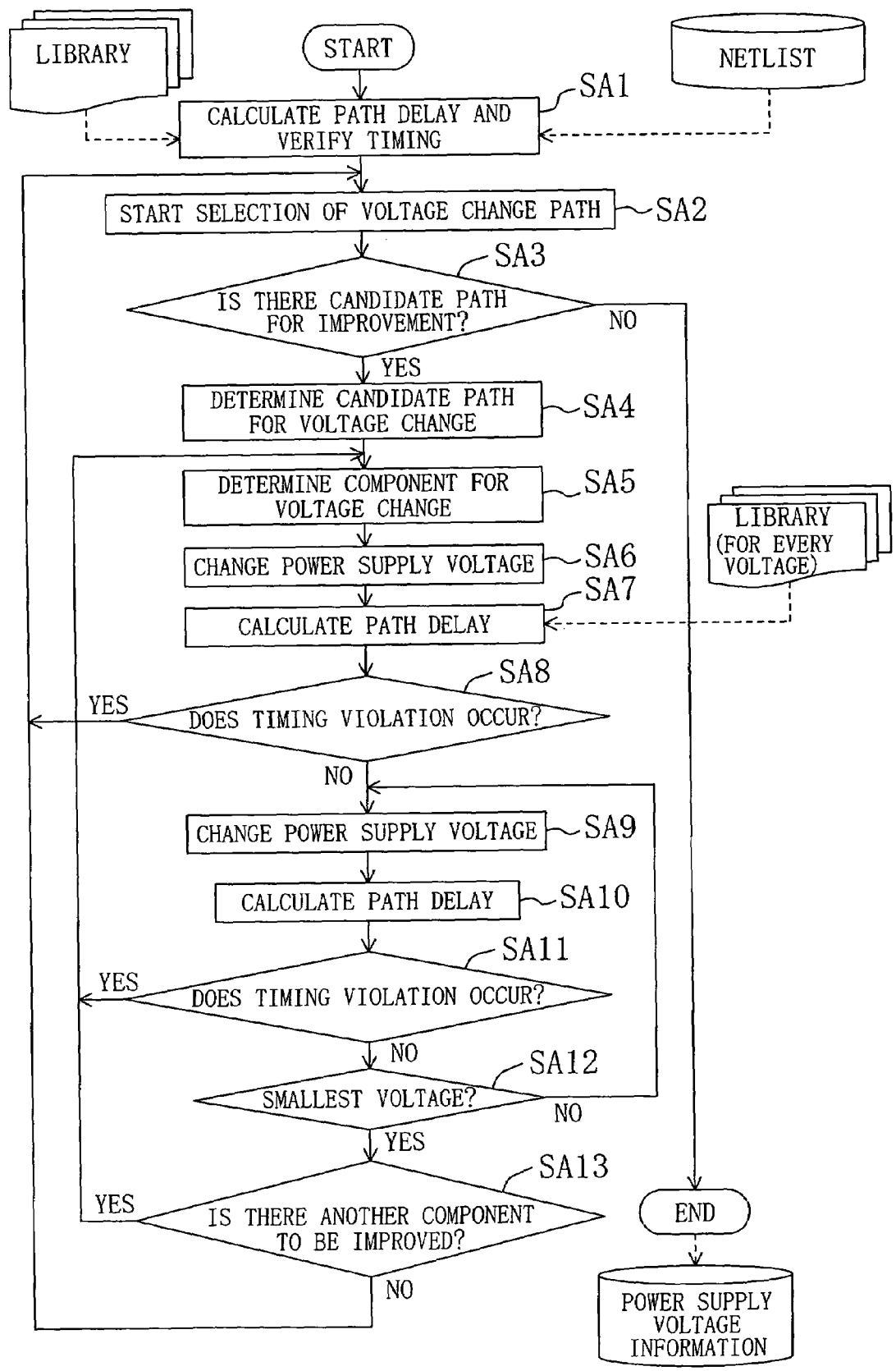
FIG. 10 is a flowchart showing a method for designing a semiconductor integrated circuit device according to a sixth embodiment of the present invention.

FIG. 10 is a flowchart showing a method for designing a semiconductor integrated circuit device according to the sixth embodiment.

The method for designing a semiconductor integrated circuit device shown in FIG. 10 is a method for determining power supply voltages to be supplied to respective components of the semiconductor integrated circuit device by using a netlist and library data regarding the components.

As shown in FIG. 10, first, in step SA1, signal delay values of paths to which components of the semiconductor integrated circuit device belong are calculated and timing verification is performed on the paths in consideration of the calculated signal delay values of the paths, using a netlist and a library in which characteristics of the components under a rated voltage supplied to the semiconductor integrated circuit device are recorded. The timing verification in step SA1 has a low accuracy because no layout information on the semiconductor integrated circuit device is provided. Therefore, the timing verification is performed including a margin of the layout as information for use in the verification.

Next, selection of a path to be subjected to a change in a power supply voltage to be supplied thereto is started in step SA2. Then, it is determined whether or not there is a path as a candidate for the change in power supply voltage in step SA3. Specifically, a path having a signal delay value with enough time before timing violation, which occurs because the signal delay value exceeds the admissible maximum signal delay value, (hereinafter, referred to a path having allowance for timing) is selected (step SA2) by using the result of the timing verification obtained in step SA1. When there is a path as a candidate for the selection (YES in step SA3), the process proceeds to step SA4. On the other hand, if there is no path as a candidate for the selection (NO in step SA3), the process terminates.

Then, in step SA4, a path as a candidate for voltage change is determined. In determining the path as a candidate for voltage change, when there are a plurality of candidate paths to be selected, a path having the largest signal delay value among paths having allowance for timing may be selected or the selection may be made empirically.

Thereafter, in step SA5, a component to be subjected to a voltage change is selected. Specifically, a component to be subjected to voltage change is selected from among components belonging to the path determined in step SA4. As a method for selecting the component, if there are components each belonging to a plurality of paths among the components belonging to the path determined in step S4, a component belonging to the largest number of paths having allowance for timing is selected. In this manner, the voltage to be supplied to the components exhibiting high frequencies of operation can be reduced, thus reducing the power consumption in the semiconductor integrated circuit effectively.

Subsequently, in step SA6, a change in power supply voltage to be supplied to a component is performed. Specifically, the change in power supply voltage is performed such that the power supply voltage which is the highest among the power supply voltages stepped down from the rated voltage in order and to be supplied to the semiconductor integrated circuit device is supplied as a voltage to be supplied to the component selected in step SA5. More specifically, library data on components is previously prepared for every power supply voltage to be supplied to the semiconductor integrated circuit device. Library data sets regarding components which are provided with different power supply voltages but have an identical function have the same name so that the name of the components in the netlist is changed depending on their function. In this manner, the highest power supply voltage among the power supply voltages stepped down from the rated voltage is supplied as a power supply voltage to be supplied to the selected component.

Then, in step SA7, path delay is calculated. Specifically, the signal delay value of a path is calculated again using the netlist in which the power supply voltage to be supplied to the component has been changed in step SA6 and library data on every power supply voltage. Then, the process proceeds to step SA8 so that it is determined whether or not the timing violation occurs in a path in the semiconductor integrated circuit device, as in step SA1, in consideration of the signal delay value of the path calculated in step SA7. When it is determined that the timing violation occurs (YES in step SA8), the power supply voltage supplied to the component subjected to the change in power supply voltage is returned to the power supply voltage before the change in step SA6, and then the process returns to step SA2 so that selection of another path to be subjected to voltage change is started. Thereafter, the above-described steps are repeated. On the other hand, when it is determined that no timing violation occurs (No in step SA8), the process proceeds to step SA9.

Thereafter, in step SA9, a change in power supply voltage to be supplied to a component is performed. Specifically, the change in power supply voltage is performed such that a power supply voltage lower than the power supply voltage that has been changed in step SA6 is supplied to the component subjected to the voltage change in step SA6. The process of changing the power supply voltage to be supplied is the same as in step SA6.

Then, in step SA10, path delay is calculated. Specifically, since the power supply voltage to be supplied to the component has been changed in step SA9, the signal delay value of the path is calculated again. Subsequently, the process proceeds to step SA11, and it is determined whether or not timing violation occurs in a path in the semiconductor integrated circuit device in consideration of the signal delay value of the path calculated in step SA9. When it is determined that the timing violation occurs (YES in step SA11), the power supply voltage to be supplied to the component subjected to the voltage change in step SA9 is returned to the power supply voltage before the change in step SA9. Subsequently, the process returns to step SA5 so that selection of another component to be subjected to voltage change is started, and thereafter the above-described steps are repeated. On the other hand, when it is determined that no timing violation occurs (No in step SA11), the process proceeds to step SA12.

Thereafter, in step SA12, it is determined whether or not the power supply voltage changed in step SA9 is the smallest among the power supply voltages to be supplied to the semiconductor integrated circuit device. When it is determined that the power supply voltage is the smallest (YES in step SA12), the process proceeds to step SA13. On the other hand, when it is determined that the power supply voltage is not the smallest (NO in step SA12), the process returns to step SA9 so that the power supply voltage to be supplied to the component is changed to a lower power supply voltage. Thereafter, the above-described steps are repeated.

Subsequently, in step SA13, it is determined whether or not there is another component as a candidate for change in power supply voltage. When it is determined that there is another component as a candidate, the process returns to step SA5, and the above-described steps are repeated. On the other hand, when there are no other components as candidates, the process returns to step SA2, and the above-described steps are repeated.

As described above, the sequence of the steps enables reduction in power supply voltages to be supplied to components belonging to all the paths having allowance for timing, without causing timing violation in the paths. In addition, the sequence of the steps allows creation of information on power supply voltages to be supplied to the components. As a result, the power consumption in the semiconductor integrated circuit device can be effectively reduced.

Embodiment 7

Figure 11:
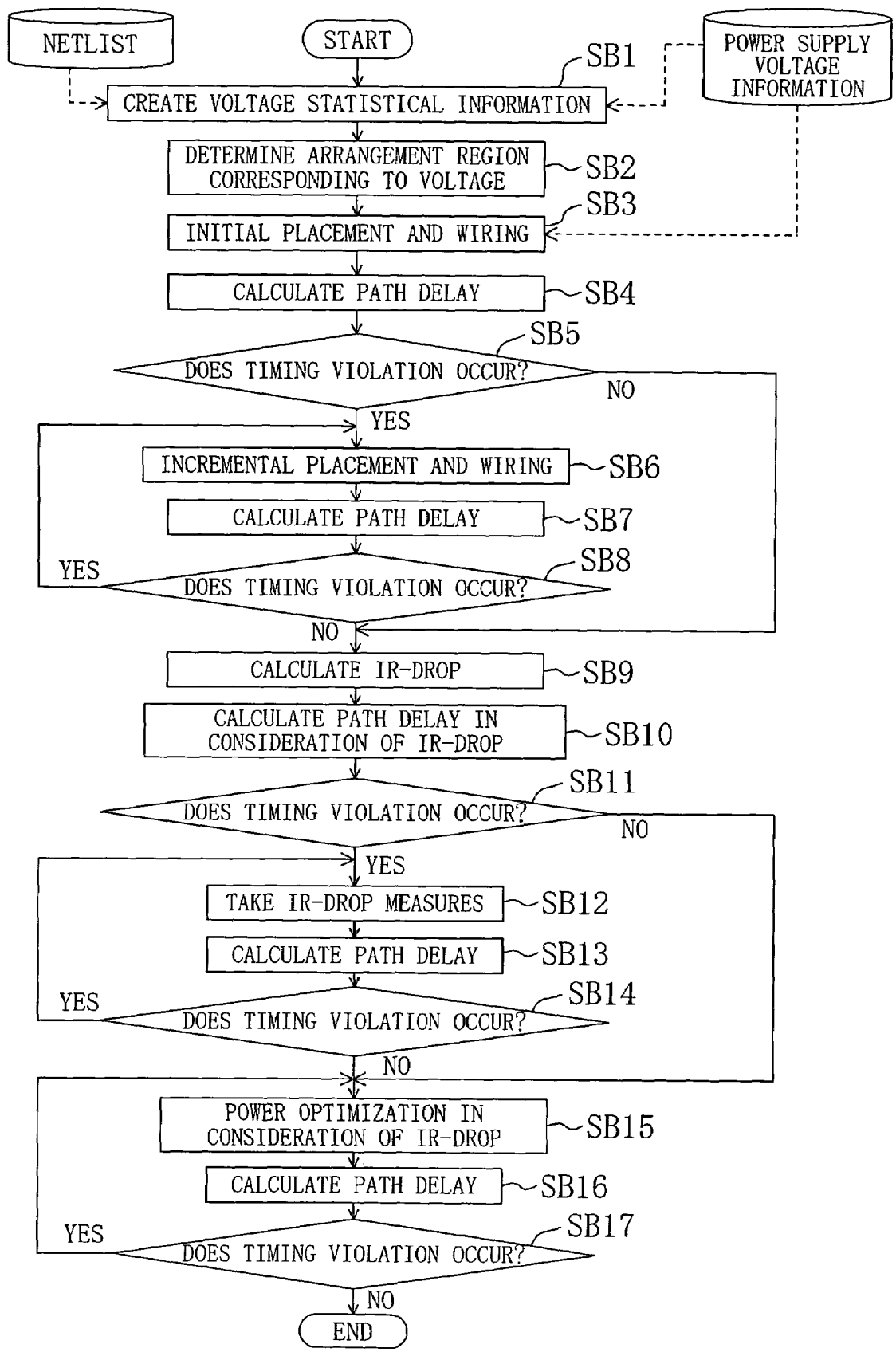
FIG. 11 is a flowchart showing a method for designing a semiconductor integrated circuit device according to a seventh embodiment of the present invention.

In the following seventh embodiment of the present invention, a specific method for arranging components of the semiconductor integrated circuit device fabricated in the sixth embodiment, using information on power supply voltages to be individually supplied to the components (hereinafter, referred to as power-supply-voltage information) and a netlist of the semiconductor integrated circuit device will be described FIG. 11 is a flowchart showing a method for designing a semiconductor integrated circuit device according the seventh embodiment.

As shown in FIG. 11, first, in step SB1, voltage statistical information is created. Specifically, the number of components receiving a power supply voltage supplied to the semiconductor integrated circuit device is calculated with respect to every power supply voltage, using a netlist of the semiconductor integrated circuit device and power-supply-voltage information on the components, thereby creating voltage statistical information.

Figure 12A:
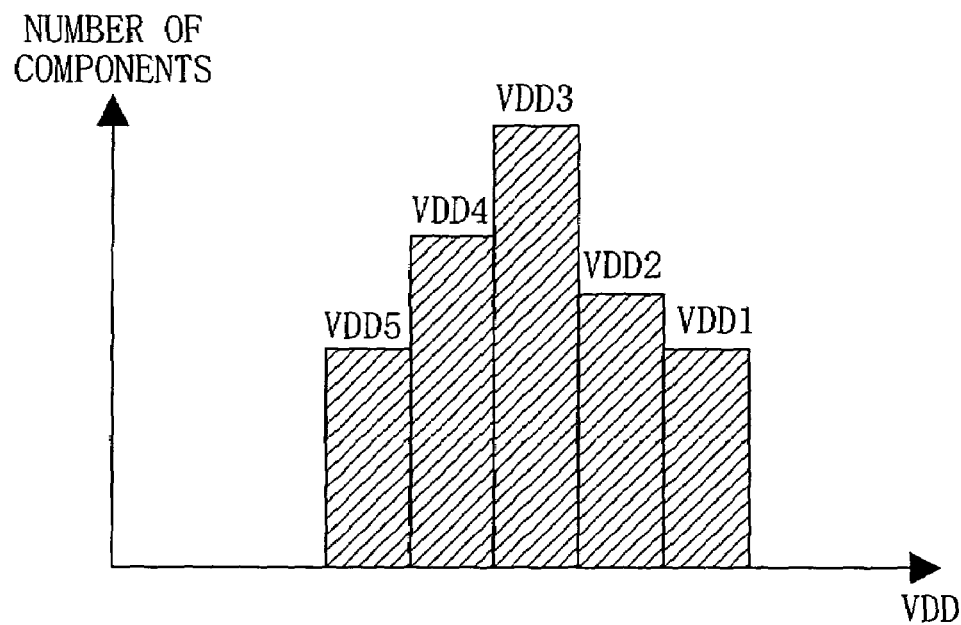
FIG. 12A is a graph showing voltage statistical information.

FIG. 12A is an example of a statistical graph showing the numbers of components receiving respective power supply voltages, with respect to every one of the power supply voltages to be supplied to the semiconductor integrated circuit device of the seventh embodiment. As shown in FIG. 12A, as voltage statistical information created in step SB1, the number of components supplied with one of the power supply voltages VDD1 through VDD5 is shown as statistics, with respect to every one of the power supply voltages VDD1 through VDD5 to be supplied to the semiconductor integrated circuit device. The voltage statistical information may be created, taking the whole of the semiconductor integrated circuit device or each circuit block constituting the semiconductor integrated circuit device, as a target.

Next, in step SB2 shown in FIG. 11, an arrangement region is determined for every power supply voltage. Specifically, arrangement regions corresponding to respective power supply voltages are defined in the semiconductor integrated circuit device using the voltage statistical information created in step SB1. As a method for defining the arrangement regions, a region may be sequentially divided from a side constituting a circuit block or the whole of the semiconductor integrated circuit device on which the voltage statistical information shown in FIG. 12A has been created, based on the ratio in statistical data indicated with the voltage statistical information. Alternatively, the region may be divided at an appropriate ratio based on an empirical rule. This division of the region in this case is achieved by separating some of the power lines for supplying voltages to components of the semiconductor integrated circuit device, as described using FIG. 7A in the fourth embodiment.

Figure 12B:
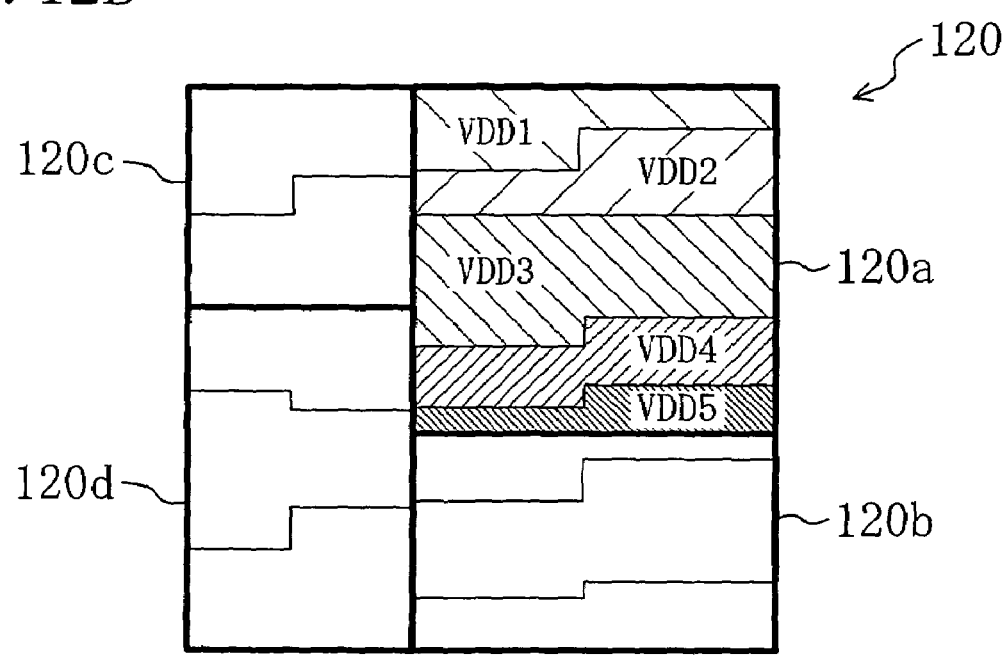
FIG. 12B is a diagram showing arrangement region corresponding to respective voltages.

FIG. 12B is a diagram showing an example of arrangement regions corresponding to respective power supply voltages in the semiconductor integrated circuit device of the seventh embodiment. As shown in FIG. 12B, a semiconductor integrated circuit device 120 includes circuit blocks 120a through 120d. In the circuit blocks 120a, arrangement regions are defined in accordance with the respective power supply voltages VDD1 through VDD5 based on the voltage statistical information shown in FIG. 12A.

Then, in step ST3 shown in FIG. 11, initial placement and wiring is performed. Specifically, the components are placed in an arrangement region to which a target power supply voltage is supplied and wiring is performed, using the arrangement region information on every power supply voltage and the power power-supply-voltage information on components determined in step SB2. In this case, the placement of the components and wiring are performed such that the signal delay value of a path to which the components of the semiconductor integrated circuit device belong does not exceed the admissible maximum signal delay value.

Thereafter, in step SB4, the signal delay value of a path in the semiconductor integrated circuit device after the initial placement in step SB3 is calculated. Specifically, the signal delay value of a path is calculated based on layout data on the semiconductor integrated circuit device after the initial placement and wiring. Then, the process proceeds to step SB5, so that it is determined whether or not timing violation occurs in a path in the semiconductor integrated circuit device in consideration of the calculated signal delay value of the path. When it is determined that the timing violation occurs, the process proceeds to step SB6. On the other hand, when it is determined that no timing violation occurs, the process proceeds to step SB9, which will be described later. It should be noted that a margin is taken into consideration in step SA1 shown in FIG. 10, so that no large timing violation is caused by the initial placement and wiring.

Subsequently, in step SB6, incremental placement and wiring is performed. Specifically, placement including the change in power supply voltage is improved with respect to components belonging to a path in which timing violation was found in step SB4, thereby reducing the timing violation.

Then, in step SB7, the signal delay value of a path is calculated. Specifically, the signal delay value of the path in the semiconductor integrated circuit device after the incremental placement and wiring in step SB6 is calculated. Then, it is determined whether or not timing violation occurs in the path in the semiconductor integrated circuit device in consideration of the calculated signal delay value of the path. When it is determined that the timing violation occurs, the process returns to step SB6, and the process of the incremental placement and wiring is performed again. On the other hand, when it is determined that no timing violation occurs, the process proceeds to step SB9.

Thereafter, in step SB9, IR-Drop calculation is performed. Specifically, voltage drop along power lines is calculated, based on the layout of the power lines in the semiconductor integrated circuit device and the placement of the components. The IR-Drop calculation may be performed by a particular method or may be performed using a tool for calculation.

Then, in step SB10, the signal consideration value of a path is calculated in consideration of the IR-Drop. Thereafter, in step SB11, it is determined whether or not timing violation occurs due to IR-Drop along a path in the semiconductor integrated circuit device, taking the signal delay value of the path in consideration of IR-Drop in the semiconductor integrated circuit device calculated in step SB9. When it is determined that the timing violation occurs, the process proceeds to step SB12. On the other hand, when it is determined that no timing violation occurs, the process proceeds to step SB15.

Subsequently, in step SB12, measures against IR-Drop are taken. Specifically, with respect to a path in which the timing violation was found based on the signal delay value of the path in consideration of the IR-Drop calculated in step SB10, a component in which the influence of the IR-Drop is largest among the components belonging to the path is moved to a region in which the influence of the IR-Drop is small. With respect to a path in which the timing violation is not improved even if the component is shifted to a region with small IR-Drop influence, if there is a component placed in a region supplied with a reduced power supply voltage among the components belonging to the path, the component is shifted to a region supplied with a power supply voltage higher than the reduced power supply voltage.

Then, in step SB13, the signal delay value of a path is calculated again. The signal delay value of a path in the semiconductor integrated circuit device on which the measures against IR-Drop has been taken in step SB12 is calculated. Thereafter, in step SB14, it is determined whether or not timing violation occurs in a path in the semiconductor integrated circuit device after the measures against IR-Drop in consideration of the signal delay value of the path calculated in step SB13. When it is determined that the timing violation occurs, the process returns to step SB12, and the measures against the IR-Drop is performed again. When it is determined that no timing violation occurs, the process proceeds to step SB15.

Subsequently, in step SB15, power optimization is performed in consideration of IR-Drop. Specifically, when it is determined that no timing violation occurs in step SB11, a component belonging to a path having allowance for timing is shifted to a region in which the influence of IR-Drop is large, as described with reference to FIGS. 8A and 8B, thus reducing the power supply voltage to be supplied to the component. As a result, the power consumption in the semiconductor integrated circuit device can be more effectively reduced in more detail.

Thereafter, in step SB16, the signal delay value of a path is calculated again. Lastly, in step SB17, it is determined whether or not timing violation occurs in a path in the semiconductor integrated circuit device after the power optimization in consideration of IR-Drop in step SB15, with the signal delay value of the path calculated in step SB16 taken into consideration. In this case, when it is determined that the timing violation occurs, the process returns to step SB15 so that the component that has been shifted for power optimization in consideration of IR-Drop is returned to the original place. Subsequently, placement of other components is changed, and thereafter the above-described steps are repeated. On the other hand, when it is determined that no timing violation occurs, the series of processing terminates.

As described above, arrangement regions in which respective power supply voltages are supplied to the components are determined using the power-supply-voltage information on the components, so that it is possible to reduce the power consumption in the semiconductor integrated circuit device without causing timing violation in a path in the semiconductor integrated circuit device. In addition, power optimization in consideration of IR-Drop is performed in addition to measures against the IR-Drop. Accordingly, it is possible to reduce the power consumption in the semiconductor integrated circuit device in consideration of IR-Drop, while preventing deterioration in the performance of the semiconductor integrated circuit device caused by the IR-Drop.

Since the inventive semiconductor integrated circuit device and the inventive method for designing the device can reduce the power consumption in the semiconductor integrated circuit device. Accordingly, it is useful to apply the device or the method to semiconductor integrated circuit devices for use in the field of mobile communication that requires especially high performance and a large scale of integration.

What is claimed is:

1. A semiconductor integrated circuit device, comprising a circuit block including a plurality of components each of which is a gate circuit, wherein at least one of the plurality of components is supplied with a voltage having a value different from that supplied to the other component or components, and each of the plurality of components is supplied with a voltage in accordance with a signal delay value caused under a given condition along a path to which said each of the components belongs.

2. The semiconductor integrated circuit device of claim 1, wherein at least one of the plurality of components which belongs to a path having a largest signal delay value is supplied with a voltage allowing the signal delay value of the path to be less than or equal to an admissible maximum signal delay value.

3. The semiconductor integrated circuit device of claim 1, wherein at least one of the plurality of components belonging to a path other than the path having the largest signal delay value is supplied with a voltage lower than the voltage supplied to the path having the largest signal delay value.

4. The semiconductor integrated circuit device of claim 1, wherein at least two of the plurality of components belonging to an identical path are supplied with voltages having at least two values, based on the signal delay value.

5. The semiconductor integrated circuit device of claim 1, wherein if step-down of a voltage to be supplied to part of the components belonging to a first path is admitted based on the signal delay value, at least one of the plurality of components belonging to both of the first path and a second path is supplied with a voltage lower than a voltage supplied to the other component or components belonging to the first path.

6. A semiconductor integrated circuit device, comprising a circuit block including a plurality of components each of which is a gate circuit, and the device including a plurality of power supplies for respectively supplying voltages having mutually different values to the circuit block, wherein at least one of the plurality of components is supplied with a voltage having a value different from that supplied to the other component or components, the plurality of components are divided and placed in a plurality of regions corresponding to the values of voltages to be supplied to the respective regions, and each of the values of the voltages to be supplied to the respective one of the plurality of components is determined based on the number of the components supplied with the voltages from the power supplies.

7. A semiconductor integrated circuit device, comprising a circuit block including a plurality of components each of which is a gate circuit, wherein at least one of the plurality of components is supplied with a voltage having a value different from that supplied to the other component or components, the plurality of components are divided and placed in a plurality of regions corresponding to the values of voltages to be supplied to the respective regions, and each of the plurality of components is placed in one of the regions, in accordance with a signal delay value caused under a given condition along a path to which said each of the components belongs.

8. A semiconductor integrated circuit device, comprising a circuit block including a plurality of components each of which is a gate circuit, wherein at least one of the plurality of components is supplied with a voltage having a value different from that supplied to the other component or components, the plurality of components are divided and placed in a plurality of regions corresponding to the values of voltages to be supplied to the respective regions, and at least two of the plurality of components belonging to an identical path are placed in at least two mutually different regions among the regions, based on a signal delay value caused under a given condition along a path to which each of the plurality of components belongs.

9. A semiconductor integrated circuit device, comprising a circuit block including a plurality of components each of which is a gate circuit, wherein at least one of the plurality of components is supplied with a voltage having a value different from that supplied to the other component or components, the plurality of components are divided and placed in a plurality of regions corresponding to the values of voltages to be supplied to the respective regions, and if step-down of a voltage to be supplied to part of the components belonging to a first path is admitted based on the signal delay value caused under a give condition along a path to which each of the plurality of components belong, at least one of the components belonging to both of the first path and a second path is placed in a region supplied with a voltage lower than a voltage supplied to a region in which the other component or components belonging to the first path is/are placed.

10. A semiconductor integrated circuit device, comprising a circuit block including a plurality of components each of which is a gate circuit, wherein at least one of the plurality of components is supplied with a voltage having a value different from that supplied to the other component or components, the plurality of components are divided and placed in a plurality of regions corresponding to the values of voltages to be supplied to the respective regions, and wherein at least one of the regions are further divided into a plurality of regions in accordance with the distance from a power line.

11. The semiconductor integrated circuit device of claim 10, wherein the distance from the power line is a distance in which an IR-Drop effect is taken into consideration.

12. The semiconductor integrated circuit device of claim 10, wherein each of the plurality of components is placed in one of the further-divided regions, in accordance with a signal delay value caused under a given condition along a path to which said each of the components belongs.

13. The semiconductor integrated circuit device of claim 12, wherein at least one of the plurality of components belonging to a path having a maximum signal delay value is placed in a region which is nearest the power line among the further-divided regions.

14. The semiconductor integrated circuit device of claim 12, wherein at least one of the plurality of components belonging to a path having a signal delay value less than an admissible maximum signal delay value under a condition in which the component is placed in one of the further-divided regions, is placed in another region having a larger distance from the power line than said one of the further-divided regions such that the signal delay value of the path is less than or equal to the admissible maximum signal delay value.

15. The semiconductor integrated circuit device of claim 10, wherein the further-divided regions are further divided into a plurality of regions in accordance with the number of connection elements connected to the power line.

16. A method for designing a semiconductor integrated circuit device including a circuit block with a plurality of components each of which is a gate circuit, wherein at least one of the plurality of components is supplied with a voltage having a value different from that supplied to the other component or components, a signal delay value caused under a given condition along a path to which each of the plurality of components belongs is calculated statistically, and the smallest voltage among voltages at which the signal delay value of the path is less than or equal to an admissible maximum signal delay value is supplied as a voltage which is to be supplied to the components and has a magnitude less than or equal to the second largest value, based on the signal delay value.

17. A method for designing a semiconductor integrated circuit device including a circuit block with a plurality of components each of which is a gate circuit, wherein at least one of the plurality of components is supplied with a voltage having a value different from that supplied to the other component or components, a signal delay value caused under a given condition along a path to which each of the plurality of components belongs is calculated, and a value according to the signal delay value is supplied to each of the components.

18. The method of claim 17, wherein voltages having at least two values are supplied to at least two of the plurality of components belonging to an identical path, based on the signal delay value.

19. The method of claim 17, wherein if step-down of a voltage to be supplied to part of the components belonging to a first path is admitted based on the signal delay value, at least one of the components belonging to both of the first path and a second path is supplied with a voltage lower than a voltage supplied to the other component or components belonging to the first path.

20. A method for designing a semiconductor integrated circuit device including a circuit block with a plurality of components each of which is a gate circuit, wherein at least one of the plurality of components is supplied with a voltage having a value different from that supplied to the other component or components, a signal delay value caused under a given condition along a path to which each of the plurality of components belongs is calculated statistically, and a plurality of regions corresponding to the values of voltages to be respectively supplied thereto are provided in the semiconductor integrated circuit device, based on the signal delay value.

21. The method of claim 20, wherein the value of a voltage to be supplied to each of the plurality of components is determined based on the number of the components to which voltages are supplied from a plurality of power supplies for respectively supplying mutually different voltages to the circuit block.

22. The method of claim 21, wherein at least one of a plurality of power lines connected to the respective ones of the plurality of components is separated so that the regions corresponding to the values of the voltages, to be supplied to the respective components are defined.

23. The method of claim 20, wherein each of the plurality of components is placed in one of the regions, based on the signal delay value.

24. The method of claim 20, wherein at least two of the plurality of components belonging to an identical path are placed in at least two mutually different regions among the regions, based on the signal delay value.

25. The method of claim 20, wherein if step-down of a voltage to be supplied to part of the components belonging to a first path is admitted based on the signal delay value, at least one of the components belonging to both of the first path and a second path is placed in a region supplied with a voltage lower than a voltage supplied to a region in which the other component or components belonging to the first path is/are placed.

26. The method of claim 20, wherein at least one of the regions are further divided into a plurality of regions in accordance with the distance from a power line.

27. The method of claim 26, wherein the distance from the power line is a distance in which an IR-Drop effect is taken into consideration.

28. The method of claim 26, wherein a signal delay value caused under a given condition along a path to which each of the plurality of components belongs is calculated, and each of the components is placed in one of the further-divided regions based on the signal delay value.

29. The method of claim 28, wherein one of the plurality of components belonging to a path having a signal delay value less than an admissible maximum signal delay value under a condition in which the component is placed in one of the further-divided regions, is placed in another region having a larger distance from the power line than said one of the further-divided regions such that the signal delay value of the path is less than or equal to the admissible maximum signal delay value.

30. The method of claim 28, a voltage to be supplied to a region in which at least one of the plurality of components belonging to a path having a signal delay value less than an admissible maximum signal delay value is placed is reduced by changing the number of connection elements in a power line to which the component is connected.

* * * * *